United States Patent
Watanabe et al.

(10) Patent No.: US 11,515,118 B2
(45) Date of Patent: Nov. 29, 2022

(54) ELECTRON BEAM IRRADIATION APPARATUS AND ELECTRON BEAM ALIGNMENT METHOD

(71) Applicant: EBARA CORPORATION, Tokyo (JP)

(72) Inventors: Kenji Watanabe, Tokyo (JP); Shinichi Okada, Tokyo (JP); Ryo Tajima, Tokyo (JP); Tsutomu Karimata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 336 days.

(21) Appl. No.: 16/794,948

(22) Filed: Feb. 19, 2020

(65) Prior Publication Data

US 2020/0273658 A1 Aug. 27, 2020

(30) Foreign Application Priority Data

Feb. 21, 2019 (JP) ............................. JP2019-029446

(51) Int. Cl.
*H01J 37/147* (2006.01)
*H01J 37/244* (2006.01)

(52) U.S. Cl.
CPC ........ *H01J 37/1471* (2013.01); *H01J 37/244* (2013.01); *H01J 2237/1501* (2013.01); *H01J 2237/24578* (2013.01)

(58) Field of Classification Search
CPC .............. H01J 37/1471; H01J 37/244; H01J 2237/1501; H01J 2237/24578
See application file for complete search history.

(56) References Cited

U.S. PATENT DOCUMENTS

| 4,939,371 A | 7/1990 | Goto |
| 5,254,856 A * | 10/1993 | Matsui ................. H01J 37/12 |
| | | 850/16 |
| 6,586,736 B1 * | 7/2003 | McCord ................. H01J 37/28 |
| | | 250/397 |
| 2006/0038125 A1 * | 2/2006 | Tsuneta .................. G01N 23/22 |
| | | 250/310 |
| 2008/0078943 A1 * | 4/2008 | Kawai ................. H01J 37/1471 |
| | | 250/397 |

(Continued)

FOREIGN PATENT DOCUMENTS

| JP | S61-190839 A | 8/1986 |
| JP | 2003-132832 A | 5/2003 |

(Continued)

*Primary Examiner* — David A Vanore
(74) *Attorney, Agent, or Firm* — Pearne & Gordon LLP (57) ABSTRACT

Provided is an electron beam irradiation apparatus including: an aligner configured to perform an alignment of an electron beam by deflecting the electron beam; a deflector having a plurality of electrodes and configured to deflect the electron beam after passing through the aligner; and an adjuster configured to adjust deflection caused by the aligner, wherein the adjuster is configured to perform, on each of the plurality of electrodes, detecting an image of the electron beam by applying a test voltage to one of the plurality of electrodes and applying a reference voltage to the other electrodes, determine a position shift of the electron beam based on each position of the image of the electron beam corresponding to each electrode, and adjust deflection of the aligner so as to cancel the position shift of the electron beam.

6 Claims, 13 Drawing Sheets

(56) References Cited

U.S. PATENT DOCUMENTS

| | | | |
|---|---|---|---|
| 2009/0146082 A1* | 6/2009 | Stengl | B82Y 40/00 |
| | | | 250/492.22 |
| 2012/0119087 A1* | 5/2012 | Takahashi | H01J 37/10 |
| | | | 250/310 |
| 2014/0021348 A1 | 1/2014 | Hoque et al. | |
| 2015/0008322 A1* | 1/2015 | Yokosuka | H01J 37/28 |
| | | | 250/311 |
| 2015/0041643 A1* | 2/2015 | Li | H01J 37/1471 |
| | | | 250/307 |
| 2016/0217969 A1* | 7/2016 | Mizuhara | H01J 37/1478 |
| 2019/0170509 A1* | 6/2019 | Kawada | H01L 21/00 |
| 2021/0012997 A1* | 1/2021 | Hayashi | H01J 37/1471 |

FOREIGN PATENT DOCUMENTS

| | | |
|---|---|---|
| JP | 2010-183004 A | 8/2010 |
| JP | 2014-022165 A | 2/2014 |

\* cited by examiner

ELECTRON BEAM IRRADIATION APPARATUS AND ELECTRON BEAM ALIGNMENT METHOD

CROSS REFERENCE TO RELATED APPLICATIONS

This application claims the benefit of Japanese Priority Patent Application JP 2019-29446 filed on Feb. 21, 2019, the entire contents of which are incorporated herein by reference.

FIELD

The present disclosure relates to an electron beam irradiation apparatus having an electron beam alignment function and an electron beam alignment method of an electron beam irradiation apparatus.

BACKGROUND

An alignment of an electron beam needs to be performed for an electron beam inspection apparatus that irradiates an electron beam to a sample through a deflector and an electron beam irradiation apparatus used in a scanning electron microscope (SEM). To perform the alignment, an ammeter is connected to each of a plurality of electrodes in a deflector, how much current flows in each electrode is measured, and a profile is generated.

However, ammeters, the number of which corresponds to that of the electrodes in the deflector, need to be connected, so there is a problem that an adjustment cost increases and time and effort are required.

Therefore, it is desired to provide an electron beam irradiation apparatus where an alignment of an electron beam can be easily performed and a simple electron beam alignment method of an electron beam irradiation apparatus.

SUMMARY

Provided is an electron beam alignment method of an electron beam irradiation apparatus configured to deflect an electron beam after passing through an aligner by using a deflector having a plurality of electrodes, the method including: performing, on each of the plurality of electrodes, detecting an image of the electron beam by applying a test voltage to one of the plurality of electrodes and applying a reference voltage to the other electrodes; determining a position shift of the electron beam based on each position of the image of the electron beam corresponding to each electrode; and adjusting deflection of the aligner so as to cancel the position shift of the electron beam.

The position shift may be determined based on a position of an image of an electron beam farthest from a reference position in an image including positions of the electron beam.

When the position shift is not clear, detecting, on each of the plurality of electrodes, the image of the electron beam by applying a voltage higher than the test voltage to one of the plurality of electrodes and applying the reference voltage to the other electrodes may be performed, and a position shift of the electron beam may be determined based on each position of the image of the electron beam corresponding to each electrode.

The electron beam alignment method may further includes, after adjusting the deflection of the aligner so as to cancel the position shift of the electron beam, checking whether the position shift is cancelled.

The checking may include: detecting, on each of the plurality of electrodes, the image of the electron beam by applying a confirmation voltage to one of the plurality of electrodes and applying the reference voltage to the other electrodes, and checking whether the position shift is cancelled based on each position of the image of the electron beam corresponding to each electron beam.

Provided is an electron beam alignment method of an electron beam irradiation apparatus configured to deflect an electron beam after passing through an aligner by using a deflector having a plurality of magnetic poles, the method including: performing, on each of the magnetic poles, detecting an image of the electron beam by flowing a test current to one of the plurality of magnetic poles and flowing a reference current to the other magnetic poles; determining a position shift of the electron beam based on each position of the image of the electron beam corresponding to each magnetic pole; and adjusting deflection of the aligner so as to cancel the position shift of the electron beam.

Provided is an electron beam irradiation apparatus including: an aligner configured to perform an alignment of an electron beam by deflecting the electron beam; a deflector having a plurality of electrodes and configured to deflect the electron beam after passing through the aligner; and an adjuster configured to adjust deflection caused by the aligner, wherein the adjuster is configured to perform, on each of the plurality of electrodes, detecting an image of the electron beam by applying a test voltage to one of the plurality of electrodes and applying a reference voltage to the other electrodes, determine a position shift of the electron beam based on each position of the image of the electron beam corresponding to each electrode, and adjust deflection of the aligner so as to cancel the position shift of the electron beam.

Provided is an electron beam irradiation apparatus including: an aligner configured to perform an alignment of an electron beam by deflecting the electron beam; a deflector having a plurality of magnetic poles and configured to deflect the electron beam after passing through the aligner; and an adjuster configured to adjust deflection caused by the aligner, wherein the adjuster is configured to perform, on each of the plurality of magnetic poles, detecting an image of the electron beam by flowing a test current to one of the plurality of magnetic poles and flowing a reference current to the other magnetic poles, determine a position shift of the electron beam based on each position of the image of the electron beam corresponding to each magnetic pole, and adjust deflection of the aligner so as to cancel the position shift of the electron beam.

DETAILED DESCRIPTION OF NON-LIMITING EXAMPLE EMBODIMENTS

Hereinafter, an embodiment according to the present disclosure will be specifically described with reference to the drawings.

Figure 1:
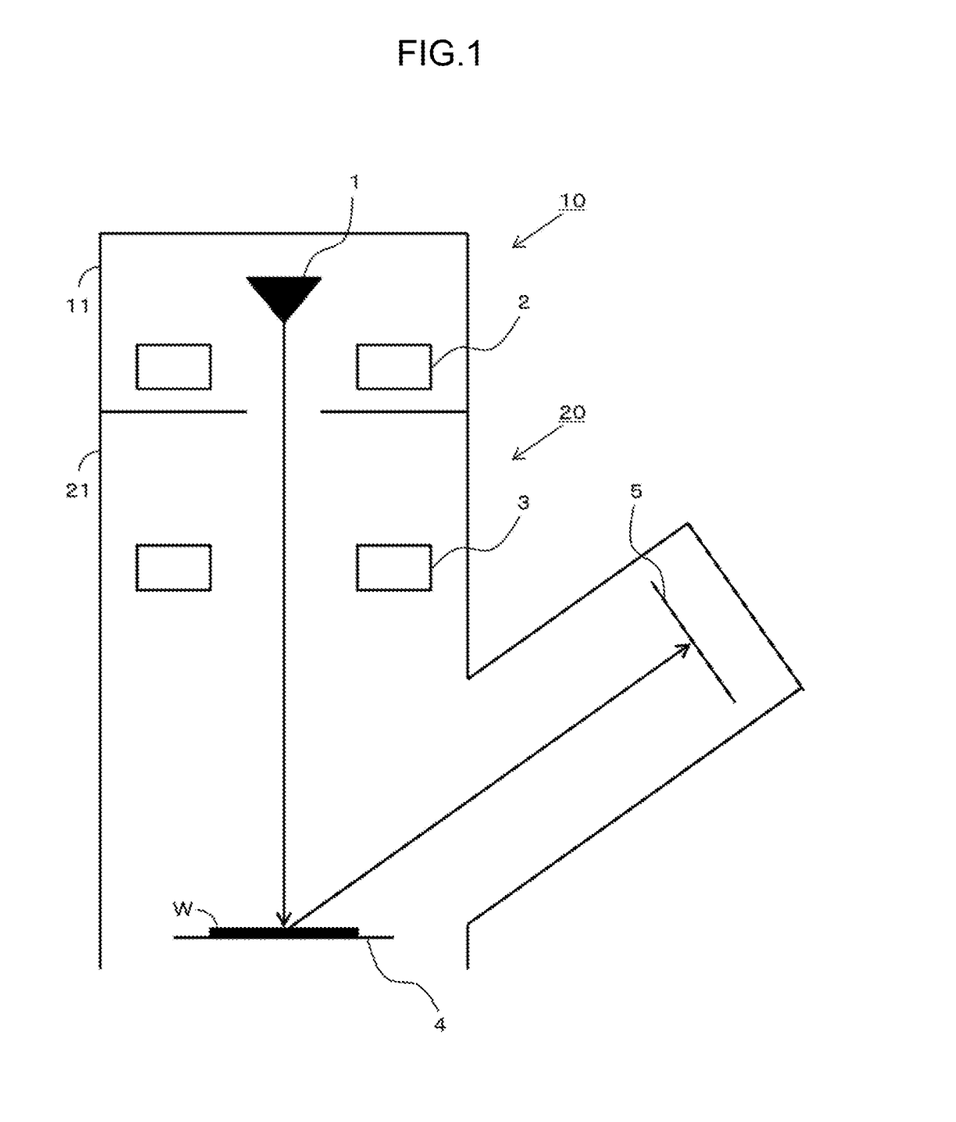
FIG. 1 is a diagram schematically showing an electron beam irradiation apparatus according to an embodiment.

FIG. 1 is a diagram schematically showing an electron beam irradiation apparatus according to the embodiment. The electron beam irradiation apparatus includes an electron source 1 (gun) and an aligner 2 that are arranged in a housing 11 of a gun unit 10, a deflector 3 (multipole) arranged in a housing 21 of a column 20, a stage 4 on which a sample W is mounted, and a detector 5 (photomultiplier). Hereinafter, each of the aligner 2 and the deflector 3 is an electrostatic deflector having a plurality of electrodes.

The electron source 1 generates an electron beam. The aligner 2 deflects the electron beam from the electron source 1 in order to align the deflector 3 described later. The electron beam passing thorough the aligner 2 enters into the column 20 through an opening of the housing 11 of the gun unit 10 and an opening of the housing 21 of the column 20. The deflector 3 deflects the electron beam to scan the sample W on the stage 4. The detector 5 detects the electron beam reflected by the sample W and forms an image including an image of the electron beam. Hereinafter, the electron beam irradiated from the electron source 1 to the sample W may be referred to as a primary beam and the electron beam from the sample W to the detector 5 may be referred to as a secondary beam.

Figure 2A:
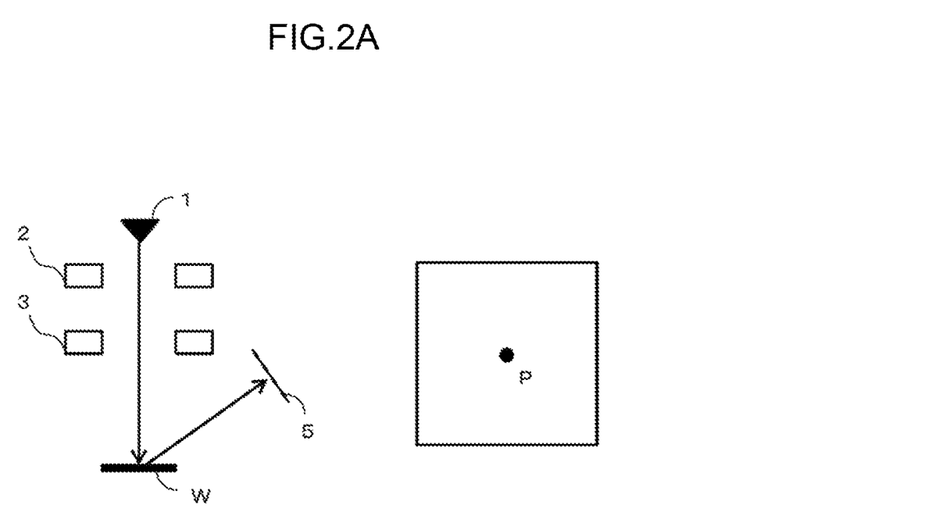
FIG. 2A is a diagram schematically showing a relationship between an electron source 1 and a position of a secondary beam.

The housing 11 of the gun unit 10 and the housing 21 of the column 20 are fixed and assembled together with bolts or the like (not shown in the figures). In an ideal state in which there is no assembly error between the housings and there is no mounting error of the electron source 1, when a reference voltage (for example, 0 V) is applied to all the electrodes of the deflector 3, the primary beam reaches the center of the sample W. As a result, an image P of the secondary beam appears in the center (reference position) of an image formed by the detector 5 (see FIG. 2A).

Figure 2B:
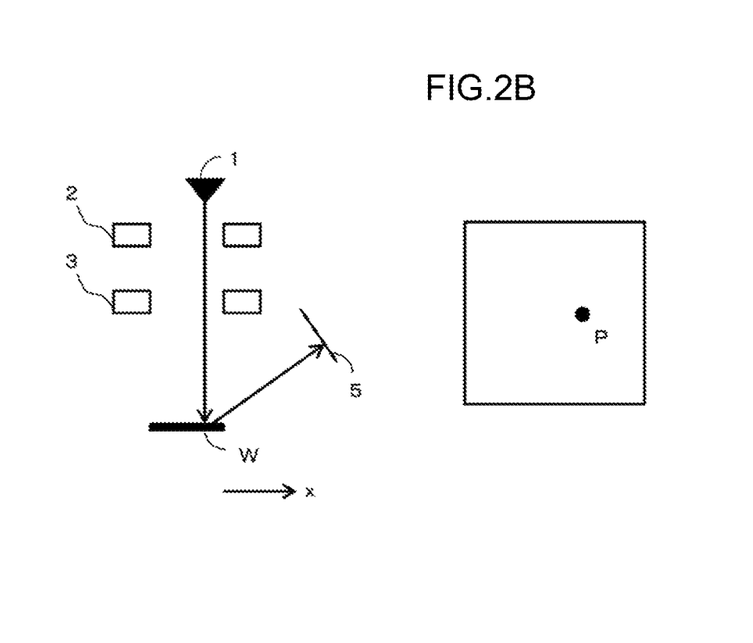
FIG. 2B is a diagram schematically showing a relationship between the electron source 1 and a position of the secondary beam.

However, in practice, when the housing 11 of the gun unit 10 and the housing 21 of the column 20 are inaccurately assembled or there is an mounting error of the electron source 1, even if the reference voltage is applied to all the electrodes of the deflector 3, the primary beam reaches a position shifted from the center of the sample W. As a result, an image of the secondary beam appears at a position shifted from the center of the image formed by the detector 5. For example, when the primary beam is shifted in an x direction, the image P of the secondary beam is also shifted in the x direction (see FIG. 2B).

When an aperture is arranged immediately before the deflector 3, position adjustment of the primary beam is not required. However, aberration and distortion caused by the deflector 3 may become remarkable depending on configurations of a lens (not shown in the figures) and the aligner 2. In this case, the position adjustment is required.

Figure 2C:
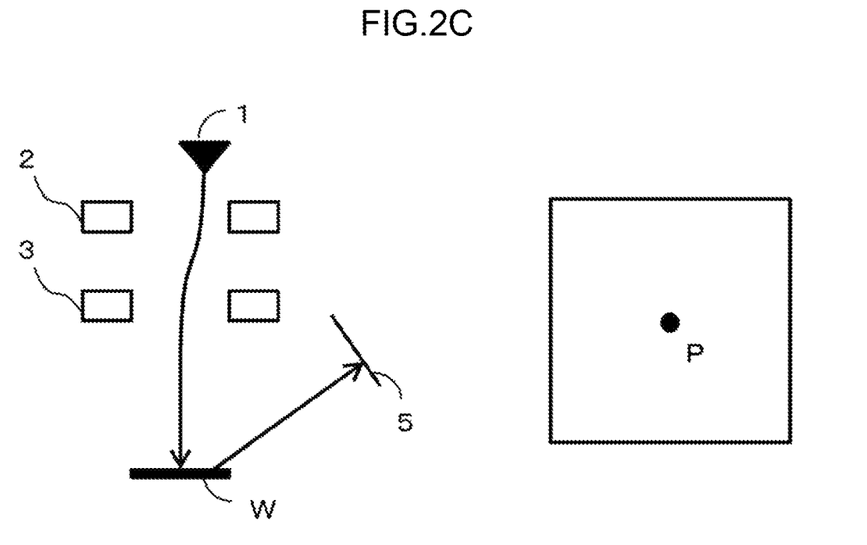
FIG. 2C is a diagram schematically showing an alignment of an electron beam of the electron source 1.

The aligner 2 is used for the adjustment in such a case. Specifically, it is necessary to perform an alignment of the electron beam by adjusting (deflecting) the electron beam by the aligner 2 so that when the reference voltage is applied to all the electrodes of the deflector 3, the primary beam reaches the center of the sample W, in other words, the image of the secondary beam is located in the center of the image (see FIG. 2C).

Hereinafter, configuration examples of the aligner 2 and the deflector 3 will be described, and then an adjustment method of the aligner 2 will be described.

Figure 3:
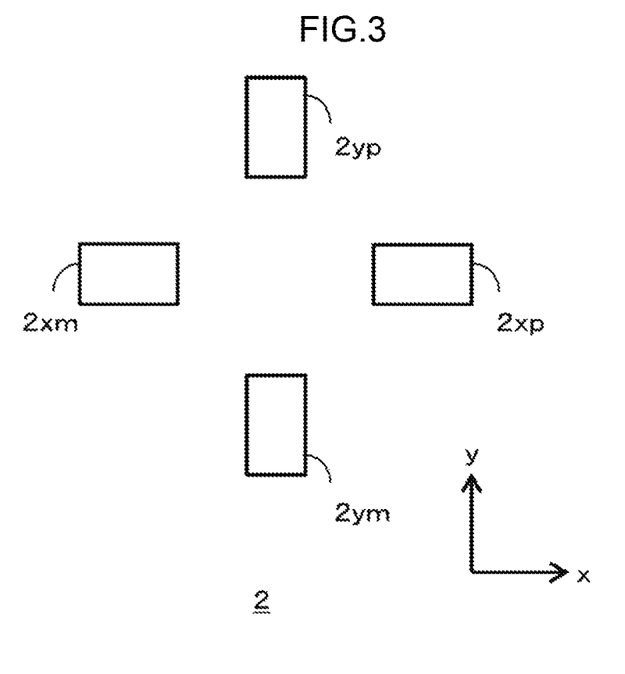
FIG. 3 is a top view schematically showing an aligner 2.

FIG. 3 is a top view schematically showing then aligner 2. The aligner 2 has a plurality of electrodes $2xp$, $2xm$, $2yp$, and $2ym$ (in four directions; +x direction, −x direction, +y direction, and −y direction in the present embodiment). For example, when a positive voltage is applied to the electrode $2xp$ in the +x direction, the primary beam is deflected in the +x direction. A relationship between a voltage applied to each electrode, and a deflection direction and a deflection amount of the primary beam is uniquely determined and can be grasped by simulation and calculation. The primary beam can be deflected in an arbitrary direction by providing at least four electrodes.

As described above, the aligner 2 is adjusted so that the primary beam from the electron source 1 reaches the center of the sample W when the reference voltage is applied to all the electrodes of the deflector 3. In other words, a fixed voltage is applied to each electrode of the aligner 2.

Figure 4:
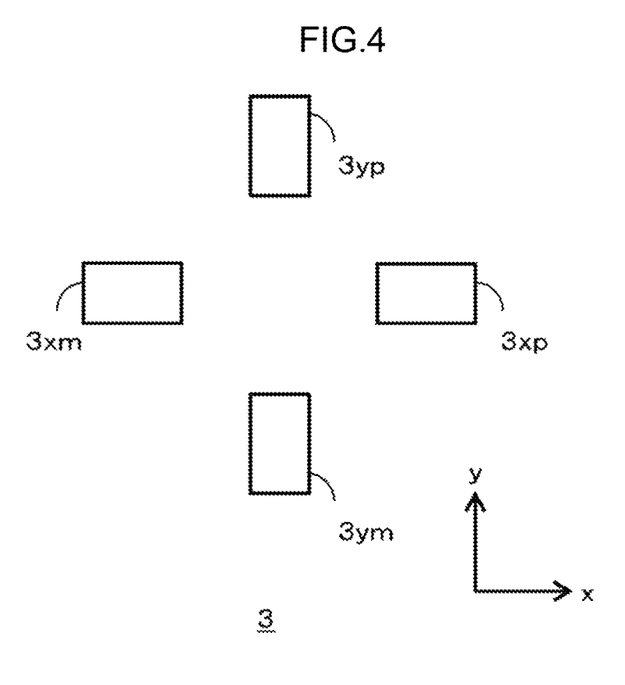
FIG. 4 is a top view schematically showing a deflector 3.

FIG. 4 is a top view schematically showing the deflector 3. The deflector 3 can have a configuration similar to that of the aligner 2, and has a plurality of electrodes $3xp$, $3xm$, $3yp$, and $3ym$ (in four directions; +x direction, −x direction, +y direction, and −y direction in the present embodiment). For example, when the electrodes $3xp$, $3xm$, and $3yp$ in the +x direction, the −x direction, and the +y direction are fixed to the reference voltage and a voltage applied to the electrode $3ym$ in the −y direction is gradually increased, the position at which the primary beam reaches on the sample W gradually moves in the −y direction.

As described above, the deflector 3 is used to scan the sample W.

Figure 5:
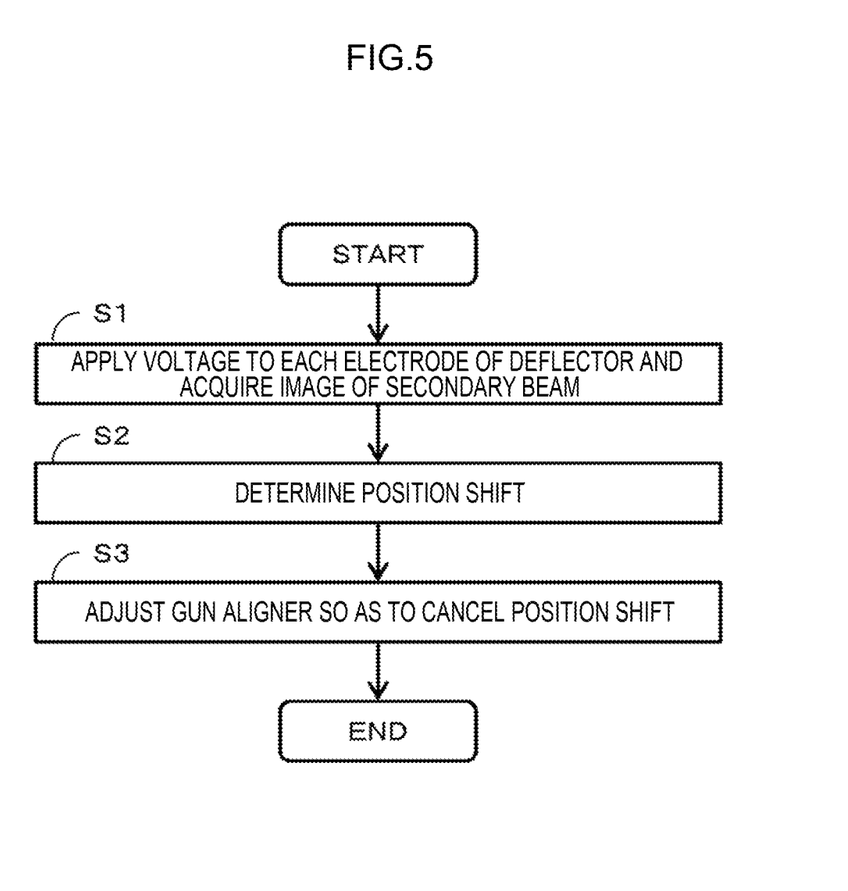
FIG. 5 is a flowchart for explaining an overview of an adjustment method of the aligner 2.

FIG. 5 is a flowchart for explaining an overview of the adjustment method of the aligner 2.

First, an image of the secondary beam is acquired by applying a test voltage (for example, the reference voltage +30V) to one electrode of the deflector 3 and applying the reference voltage to the other three electrodes. The above operation is performed on each of the electrodes $3xp$, $3xm$, $3yp$, and $3ym$ (step S1). Then, it is determined in which direction and how much the primary beam is shifted for the electrode (in this case, the deflector 3) from the result of the operation (step S2).

Figure 6A:
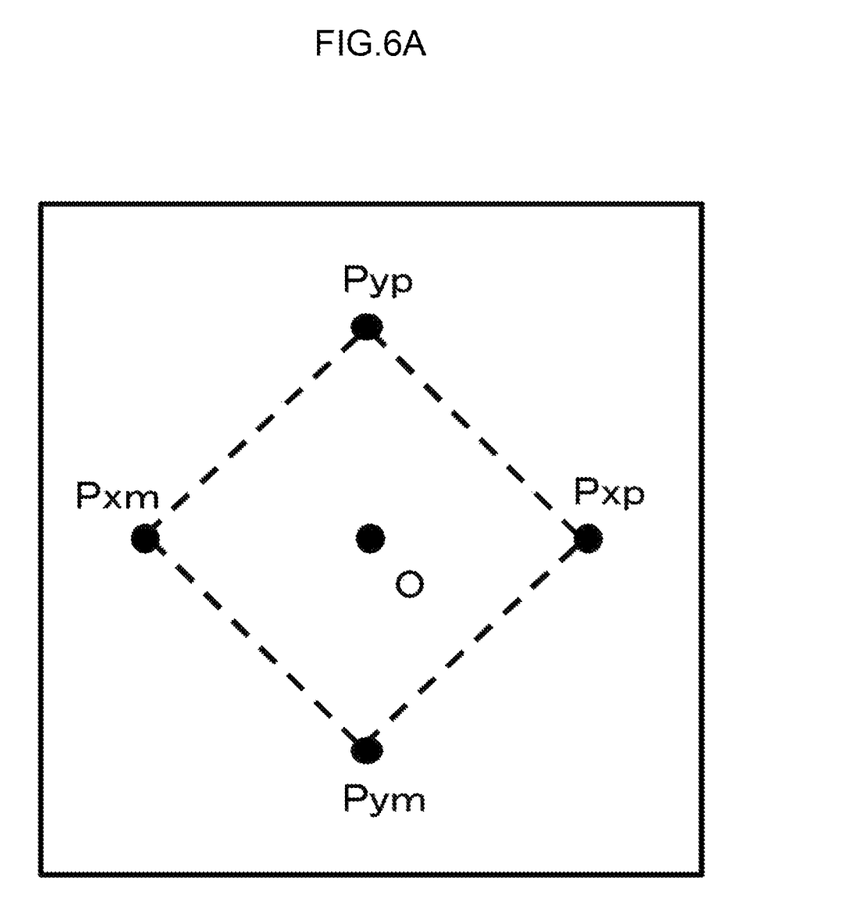
FIG. 6A is a diagram schematically showing an example of an image including an image of the secondary beam.

FIG. 6A is a diagram schematically showing an example of an image including the image of the secondary beam and shows a case in which a pattern including a black circle in the center of the sample W is observed. Points Pxp, Pxm, Pyp, and Pym are positions of an image of the secondary beam that appears when the test voltage is applied to the electrodes 3xp, 3xm, 3yp, and 3ym, respectively. In FIG. 6A, a quadrangle having the points Pxp, Pxm, Pyp, and Pym as vertexes (hereinafter referred to as a quadrangle Pxp, Pxm, Pyp, and Pym) is a square, and distances between a center O and the points Pxp, Pxm, Pyp, and Pym are equal to each other. In this case, the Pxp, Pxm, Pyp, and Pym are coincident with theoretical coordinates, and it is determined that there is no position shift of the primary beam.

Figure 6B:
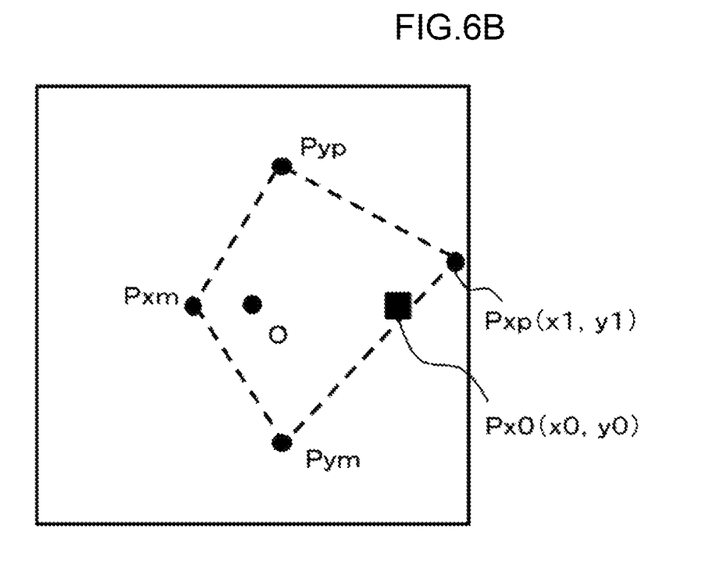
FIG. 6B is a diagram schematically showing an example of an image including an image of the secondary beam.

FIG. 6B is a diagram schematically showing an example of an image including the image of the secondary beam. In FIG. 6B, the quadrangle Pxp, Pxm, Pyp, and Pym is not a square. A distance between the center O and a point PxO is the longest (the point PxO indicates theoretical coordinates of the point Pxp obtained from a simulation of a deflection sensitivity). In this case, the primary beam is shifted on the electrode 3xm side (on the left side) is specifically located on a straight line connecting the point Pxm and the point Pxp. The longer the distance between the point O and the point Pxp with respect to the distance between the point O and the point Pxm, the larger the amount of shift. In FIG. 6B, the distance between the primary beam and the electrode 3xm is smaller than the distances between the primary beam and the other electrodes, so that an original voltage from the electrode 3xm is not applied to the primary beam due to an affection of electric fields from other electrodes. Therefore, the deflection amount is smaller than a theoretical value.

In this way, a direction in which the primary beam is shifted and an amount by which the primary beam is shifted are determined based on a position of a point (the image of the electron beam) farthest from the center O.

Let us return to FIG. 5. The deflection of the aligner 2 is adjusted so as to cancel the position shift determined in step S2 (step S3). Specifically, for adjusting the deflection direction of the aligner 2, when the position shift occurs as shown in FIG. 6B, the reference voltage is applied to the electrodes 2xm, 2yp, and 2ym of the aligner 2 and a voltage higher than the reference voltage is applied to the electrode 2xp in order to deflect to the electrode 2xp side. Further, for adjusting the deflection direction of the aligner 2, the level of the voltage is corresponding to (proportional to) the distance between the point O and the point Pxp with respect to the distance between the point O and the point Pxm in FIG. 6B. Although described later with reference to FIG. 7, the position shift cannot necessarily be canceled by one adjustment, so that it is preferable to check whether the position shift is cancelled and perform further adjustment when the position shift is not cancelled.

By doing so, it is possible to easily adjust the voltage to be applied to each electrode of the aligner 2 without taking time and effort of measuring current flowing through each electrode.

Figure 7:
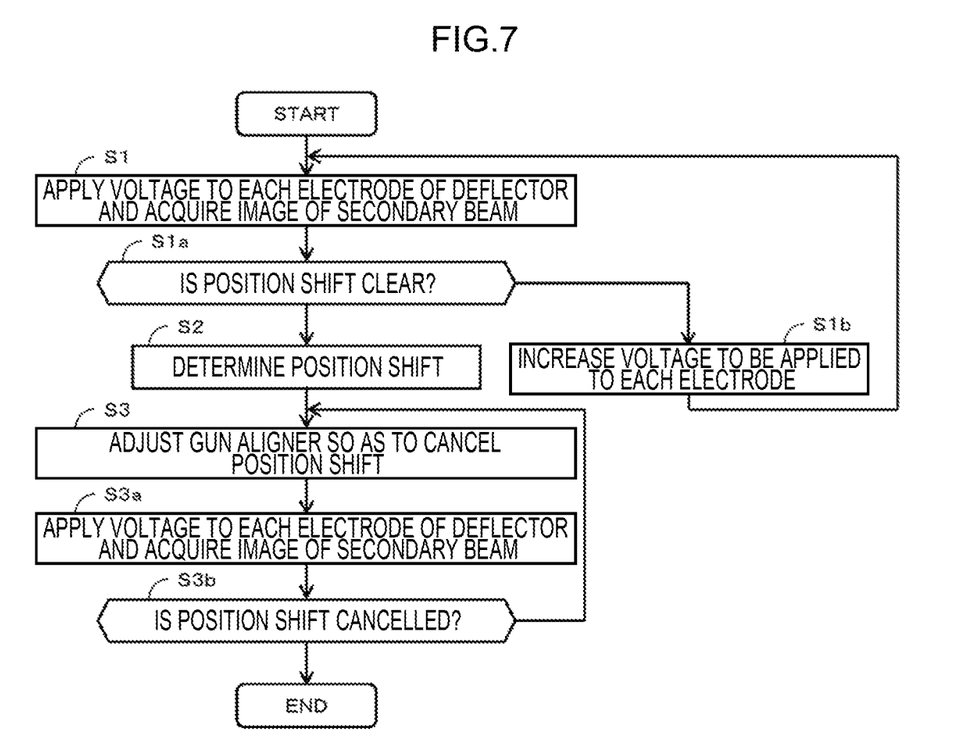
FIG. 7 is a flowchart for explaining details of the adjustment method of the aligner 2.

FIG. 7 is a flowchart for explaining details of the adjustment method of the aligner 2.

First, as described in step S1 in FIG. 5, the test voltage is applied to one electrode of the deflector 3, the reference voltage is applied to the other three electrodes, and an image of the secondary beam is acquired. The above operation is performed on each electrode (step S1) and whether or not the position shift of the primary beam is clear is determined from the result of step S1 (step S1a).

Figure 8A:
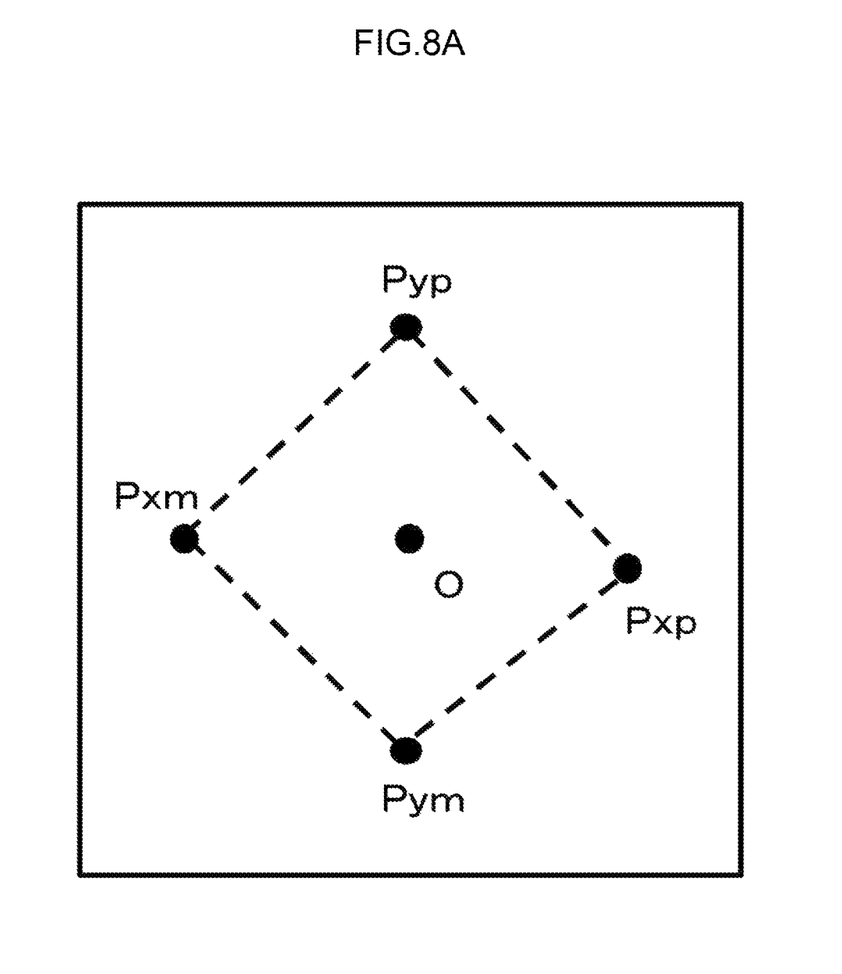
FIG. 8A is a diagram showing that position shift is not clear (from which it is difficult to recognize that the bean is shifted from a center of the electrodes)

For example, as shown in FIG. 8A, the quadrangle Pxp, Pxm, Pyp, and Pym is slightly different from a square, it is not clear what kind of position shift occurs. Namely, it is difficult to recognize that the bean is shifted from a center of the electrodes from FIG. 8A. Specifically, when a difference between the maximum value and the minimum value of the distances between the center O and the points Pxp, Pxm, Pyp, and Pym is less than or equal to a threshold value, it may be determined that the position shift is not clear. Alternatively, when the maximum value of distances between the points Pxp, Pxm, Pyp, and Pym and each theoretical value is less than a threshold value, it may be determined that the position shift is not clear.

When the position shift is not clear, a voltage to be applied to each electrode of the deflector 3 is increased so as to increase the deflection amount (step S1b) and then step S1 is performed. For example, when the reference voltage +30 V is applied in the first time step S1, the reference voltage +60 V is applied in the second time step S1.

Figure 8B:
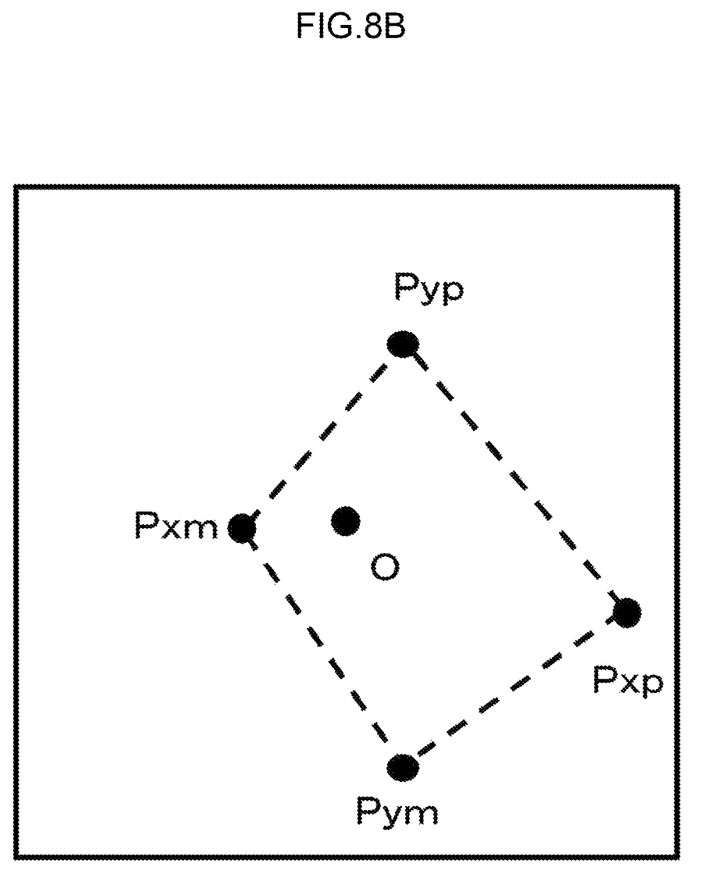
FIG. 8B is a diagram showing that position shift is clear.

By doing so, as shown in FIG. 8B, a shift of the quadrangle Pxp, Pxm, Pyp, and Pym from a square increases.

The above operation is performed until the position shift becomes clear, and the position shift is determined (step S2). Then, voltages are applied to the electrodes of the aligner 2 so as to cancel the determined position shift (step S3).

In order to confirm that the position shift is cancelled in this state, an image of the secondary beam is acquired by applying a confirmation voltage (for example, the reference voltage +30V) to one electrode of the deflector 3 and applying the reference voltage to the other three electrodes. The above operation is performed on each electrode (step S3a).

When the position shift is cancelled by the operation of step S3a (YES of step S3b), adjustment processing is completed. Whether or not the position shift is cancelled can be determined by whether or not the quadrangle Pxp, Pxm, Pyp, and Pym can be regarded as a square. Specifically, it can be determined that the position shift is cancelled when a difference between the maximum value and the minimum value of the distances between the center O and the points Pxp, Pxm, Pyp, and Pym is less than or equal to a threshold value. Alternatively, it can be determined that the position shift is cancelled when the maximum value of the distances between the points Pxp, Pxm, Pyp, and Pym and each theoretical value is less than a threshold value. Further, it can be determined that the position shift is cancelled when the absolute value sum of the distances between the points Pxp, Pxm, Pyp, and Pym and each theoretical value is less than a threshold value.

On the other hand, when the position shift is not cancelled (NO of step S3b), the aligner 2 is adjusted again (step S3). Specifically, when the adjustment is insufficient in the previous step S3, a voltage to be applied to each electrode of the aligner 2 is increased so as to increase the deflection amount. On the other hand, when the adjustment is excessive in the previous step S3, a voltage to be applied to each electrode of the aligner 2 is set to low (for example, to one half) so as to decrease the deflection amount.

The above operation is performed until the position shift is cancelled.

In this way, in the present embodiment, the position shift of the electron beam is determined by detecting an image of the secondary beam by applying the test voltage one by one to each electrode of the deflector 3, and the deflection of the aligner 2 is adjusted so as to cancel the position shift. Therefore, the aligner 2 can be easily adjusted.

At least part of the adjustment method described above may be manually performed or may be automatically performed by providing an adjustment means. The aligner 2 and/or the deflector 3 need not necessarily be an electrostatic deflector having electrodes, but may be a magnetic field deflector having magnetic poles. In this case, the application of voltage in the above description may be replaced by an operation of flowing current (giving magnetic field) to the magnetic poles. Further, there is no limitation of the numbers of electrodes and magnetic poles. For example, when there are n poles, the "square" in the above description may be replaced by a "regular n-polygon". The electron beam need not necessarily be adjusted by the aligner 2 provided close to (immediately below) the electron source 1, but may be adjusted by an aligner arranged on the upstream side of (for example, immediately above) a deflector and a lens desired to adjust the center.

Figure 9A:
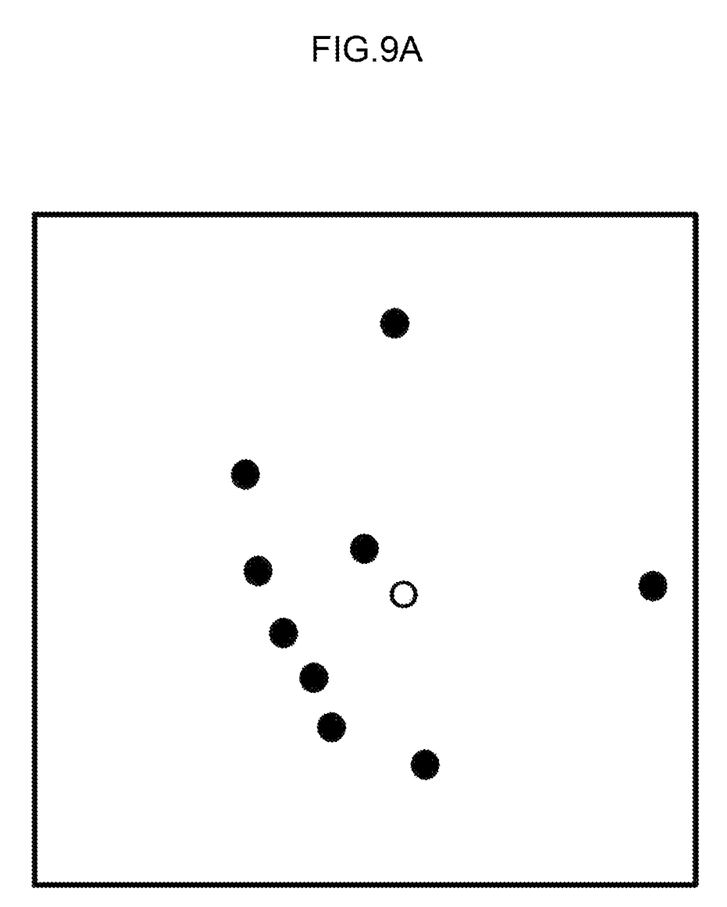
FIG. 9A is a diagram schematically showing an image when there is a position shift of electron beam in an eight-pole deflector.
Figure 9B:
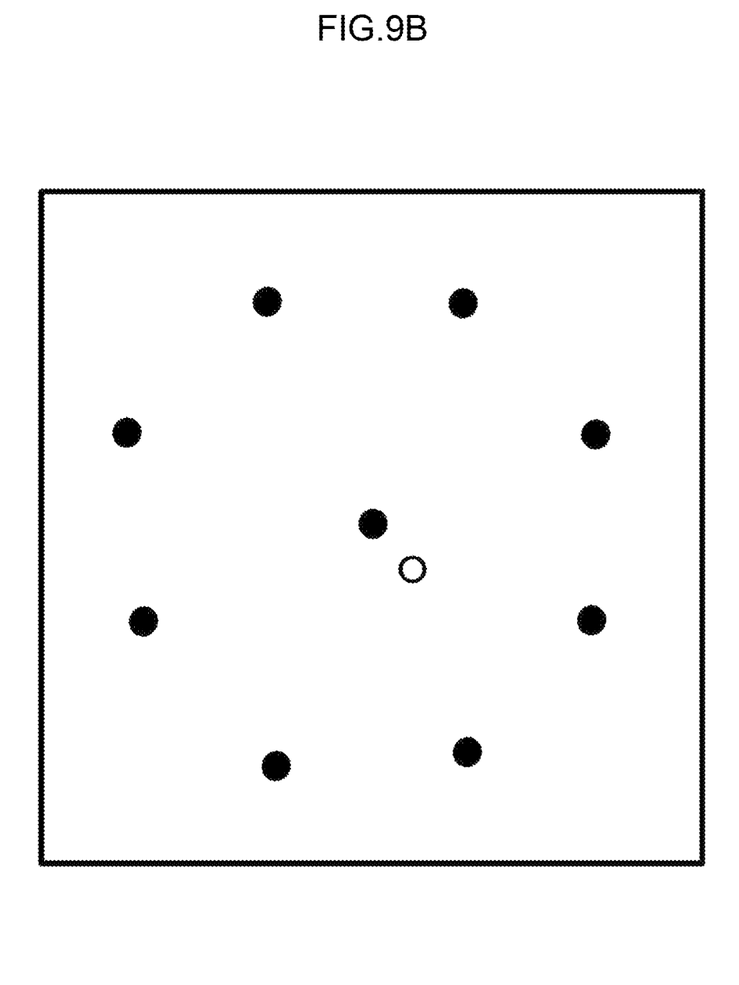
FIG. 9B is a diagram schematically showing an image after an alignment of electron beam in the eight-pole deflector.

Further, the number of poles of the deflector 3 is not limited to four, but may be, for example, eight or more. In the case of eight poles, when there is a position shift of the primary beam, as shown in FIG. 9A, a point corresponding to one electrode is far away from the center and the eight points form a shape like Cygnus. Also in this case, it is possible to form a substantially regular octagon shown in FIG. 9B by performing an alignment by the method described above.

The electron beam alignment method described above can be applied to an electron beam inspection apparatus and an SEM.

Figure 10:
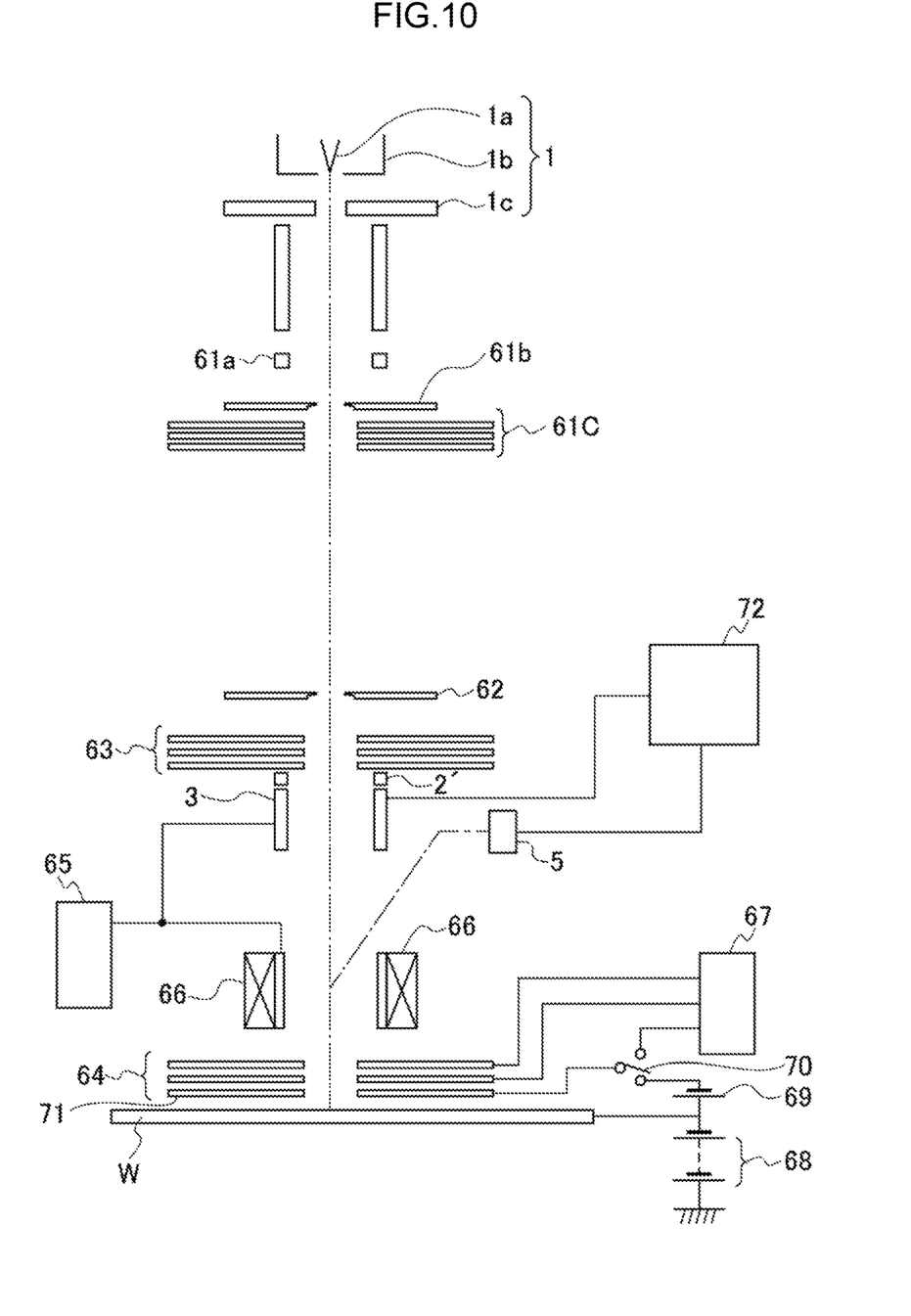
FIG. 10 is a diagram schematically showing an SEM to which the present disclosure is applied.

FIG. 10 is a schematic diagram showing a schematic configuration of the SEM. The electron source 1 is a three-pole electron gun composed of a cathode 1a, a Wehnelt 1b, and an anode 1c. The cathode 1a causes a thermal cathode of $LaB_6$ to operate under space charge limiting conditions.

A primary electron beam which is emitted from the electron source 1 and passes through an aligner 61a irradiates a form opening 61b having a square shape, and an image of electron gun crossover is formed in an NA opening 62 by a capacitor aligner 2. An image of the form opening 61b is formed as a reduced image a little below a lens 63 by a lens 61c and the lens 63, and a very small probe is created on the sample W by an objective lens 64. A scanning power supply 65 is designed so that the electron beam is two-stage deflected by the deflectors 3 and 66 and can raster-scan or vector-scan a 200 μm square on the sample W.

An aligner 2' for performing an alignment of the electron beam is arranged above the deflector 3 (on the side of the electron source 1) arranged between an ExB lens 63 and the deflector 66 and is used for the alignment described above.

The objective lens 64 can be connected with a power supply 67 that can give a voltage where an aberration coefficient is the smallest within a range where an electric discharge is not generated between electrodes or between the lens and the sample W. However, a switching switch 70 is provided so as to be able to apply a voltage 69 lower than a negative voltage 68 of the sample W for measuring potential contrast.

When obtaining an SEM image by secondary electrons emitted from a surface of the sample, a voltage is supplied from the power supply 67 to an axially symmetry electrode 71 provided in an area close to an optical axis adjacent to the sample W as a lower electrode of a retarding field type objective lens 64. All the secondary electrons pass through the objective lens 64, are deflected rightward in FIG. 10 by an ExB separator 66, and are detected by a secondary electrode detector 5. Then, an SEM image is formed by an image forming circuit 72.

On the other hand, when measuring potential contrast, the switch 70 is switched and the voltage 69 lower than a voltage of the sample W is supplied to the electrode 71. Thereby, an area where an axial potential is lower than that of the sample W is formed. It is possible to measure the potential contrast by adjusting so that the axial potential has a value where the secondary electrons emitted from a pattern having high potential on the sample W are driven back.

Figure 11:
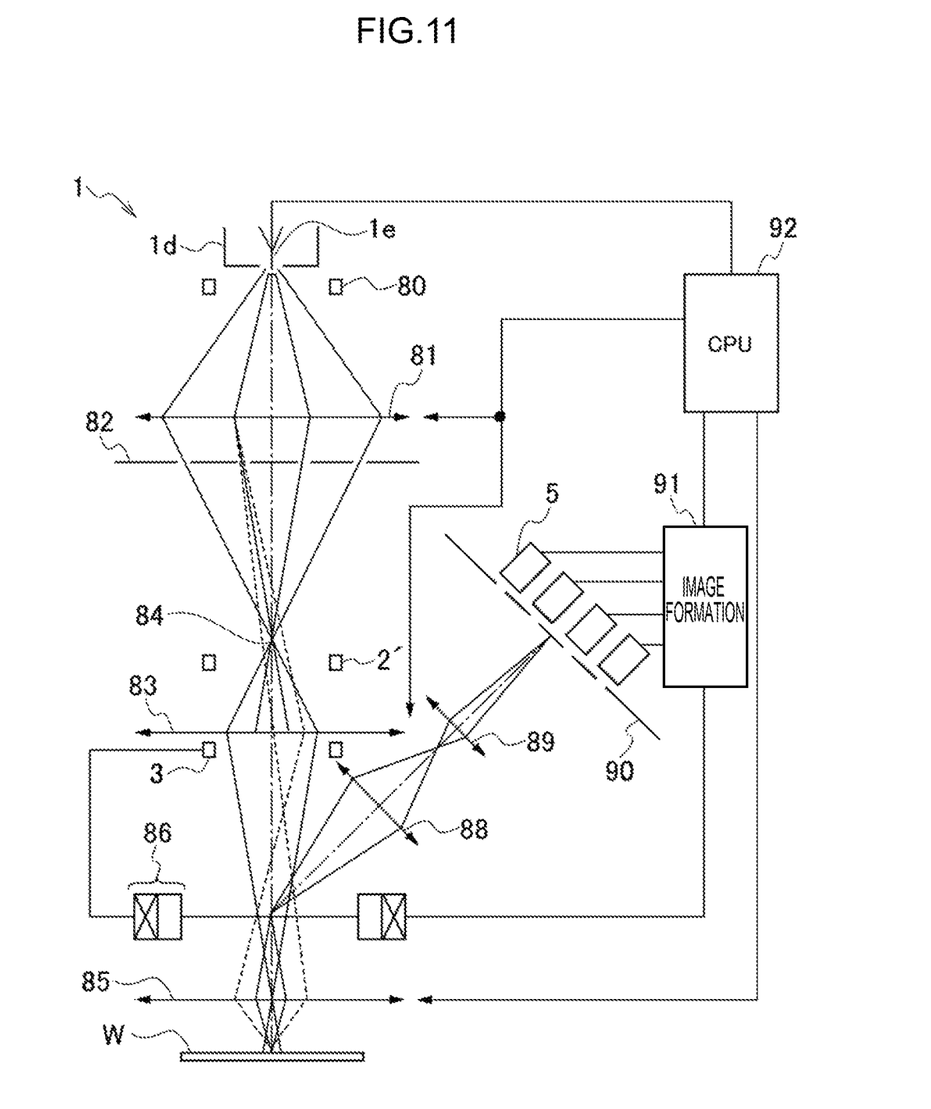
FIG. 11 is a diagram schematically showing a multi-SEM to which the present disclosure is applied.

FIG. 11 is a schematic diagram showing a schematic configuration of a multi-SEM. In the multi-SEM of FIG. 11, a W-Zr emitter 1e is protruded from Schottky shield 1d of the electron source 1 by about 100 μm more than a normal use condition. Electron beams are emitted, through the aligner 80, in five directions of the emitter 1e, that is, an optical axis direction from the center tip of the emitter 1e and four directions from four peripheral portions. These primary electron beams are converged by a condenser lens 81 and irradiate a first multi-opening plate 82 where four small openings are provided on a circumference. The electron beam in the optical axis direction is blocked by the first multi-opening plate 82. The electron beams that pass through the four openings of the first multi-opening plate 82 form a crossover at a point 84 before a reducing lens 83, are reduced by the reducing lens 83 and an objective lens 85, and form an image on the sample W. The four primary electron beams are raster-scanned at the same time on a surface of the sample W mounted on an X-Y stage (not shown in the figures) by an electrostatic deflector 3 and an EXB deflector 86.

An aligner 2' for performing an alignment of the electron beams is arranged above the electrostatic deflector 3 (on the side of the electron source 1) arranged between the reducing lens 83 and the EXB deflector 86 and is used for the alignment described above.

Secondary electron beams are emitted from the surface of the sample W by the irradiation of the primary electron beams. The secondary electron beams are accelerated by the objective lens 85 and separated from a primary optical system by the EXB deflector 86, and the secondary electron beams form an image on a detection surface of a second multi-opening plate 90 by magnifying lenses 88 and 89. Then, the secondary electron beams that pass through four openings of the second multi-opening plate 90 are detected by a multi-detector 5. Thereby, the secondary electron beams are converted into an electrical signal and the electrical signal is formed into an image by an image formation circuit 91. In FIG. 11, reference numeral 92 denotes a CPU. The CPU 92 controls a lens system and the stage and performs evaluation such as deflect detection and line width measurement of the sample W by analyzing the image obtained by the image formation circuit 91.

The above embodiment is described so that a person with an ordinary skill in the technical field to which the invention pertains can implement the invention. Various modified examples of the above embodiment can be naturally made by those skilled in the art, and the technical idea of the invention can be applied to other embodiments. Therefore, the invention is not limited to the described embodiment and should encompass the widest range in accordance with the technical ideas defined by the claims.

1 Electron source
2, 2' Aligner
2xp, 2xm, 2yp, 2ym Electrode
3 Deflector
3xp, 3xm, 3yp, 3ym Electrode
4 Stage
5 Detector
10 Gun unit
11 Housing
20 Column
21 Housing
100 Electron beam inspection apparatus

What is claimed is:

1. An electron beam alignment method of an electron beam irradiation apparatus configured to deflect an electron beam after passing through an aligner by using a deflector having a plurality of electrodes, the method comprising:
   performing, on each of the plurality of electrodes, detecting an image of the electron beam by applying a test voltage to one of the plurality of electrodes and applying a reference voltage to the other electrodes;
   determining a position shift of the electron beam based on each position of the image of the electron beam corresponding to each electrode; and
   adjusting deflection of the aligner so as to cancel the position shift of the electron beam.

2. The electron beam alignment method according to claim 1, wherein
   the position shift is determined based on a position of an image of an electron beam farthest from a reference position in an image including positions of the electron beam.

3. The electron beam alignment method according to claim 1, wherein
   when the position shift is not clear,
      detecting, on each of the plurality of electrodes, the image of the electron beam by applying a voltage higher than the test voltage to one of the plurality of electrodes and applying the reference voltage to the other electrodes is performed, and
      a position shift of the electron beam is determined based on each position of the image of the electron beam corresponding to each electrode.

4. The electron beam alignment method according to claim 1, further comprising, after adjusting the deflection of the aligner so as to cancel the position shift of the electron beam, checking whether the position shift is cancelled.

5. The electron beam alignment method according to claim 4, wherein the checking comprises:
   detecting, on each of the plurality of electrodes, the image of the electron beam by applying a confirmation voltage to one of the plurality of electrodes and applying the reference voltage to the other electrodes, and
   checking whether the position shift is cancelled based on each position of the image of the electron beam corresponding to each electron beam.

6. An electron beam alignment method of an electron beam irradiation apparatus configured to deflect an electron beam after passing through an aligner by using a deflector having a plurality of magnetic poles, the method comprising:
   performing, on each of the magnetic poles, detecting an image of the electron beam by flowing a test current to one of the plurality of magnetic poles and flowing a reference current to the other magnetic poles;
   determining a position shift of the electron beam based on each position of the image of the electron beam corresponding to each magnetic pole; and
   adjusting deflection of the aligner so as to cancel the position shift of the electron beam.

* * * * *